United States Patent [19]

Chen et al.

[11] Patent Number: 5,148,059
[45] Date of Patent: Sep. 15, 1992

[54] CMOS AND ECL LOGIC CIRCUIT REQUIRING NO INTERFACE CIRCUITRY

[75] Inventors: Chih-Liang Chen, Briarcliff; Peter W. Cook, Mount Kisco; Lewis M. Terman, South Salem, all of N.Y.

[73] Assignee: International Business Machines Corporation, Armonk, N.Y.

[21] Appl. No.: 679,363

[22] Filed: Apr. 2, 1991

[51] Int. Cl.[5] .................. H03K 19/092; H03K 19/086
[52] U.S. Cl. .................................. 307/475; 307/451; 307/455
[58] Field of Search ............... 307/455, 451, 450, 448, 307/475

[56] References Cited

U.S. PATENT DOCUMENTS

| | | | |
|---|---|---|---|
| 4,453,095 | 6/1984 | Wrathall | 307/475 |
| 4,645,951 | 2/1987 | Uragami | 307/475 |
| 4,656,375 | 4/1987 | Lauffer et al. | 307/475 |
| 4,782,251 | 11/1988 | Tsugaru et al. | 307/475 |
| 4,794,317 | 12/1988 | van Tran | 323/316 |
| 4,806,799 | 2/1989 | Pelley, III et al. | 307/475 |
| 4,864,159 | 9/1989 | Cornelissen | 307/264 |
| 4,890,019 | 12/1989 | Hoyte et al. | 307/475 |
| 4,897,564 | 1/1990 | Chen | 307/446 |
| 4,906,871 | 3/1990 | Iida | 307/475 |
| 4,912,347 | 3/1990 | Morris | 307/475 |
| 4,914,321 | 4/1990 | Davis | 307/446 |
| 4,939,478 | 7/1990 | Heimsch et al. | 307/475 |

Primary Examiner—Edward P. Westin
Assistant Examiner—Richard Roseen
Attorney, Agent, or Firm—Perman & Green

[57] ABSTRACT

An ECL circuit (12) for directly coupling to and from a CMOS circuit (10). The ECL circuit has an input node for receiving an input signal generated by a CMOS circuit. The input signal swings, or transitions, between a first potential ($V_0$) and a second potential ($V_1$). The ECL circuit further includes ECL core circuitry ($Q_3$, $Q_4$, $R_L$), coupled to the input node and responsive the received signal, for generating an intermediate electrical signal that swings between a third potential ($V_2$) and a fourth potential ($V_3$) that is approximately two times ($V_1 - V_0$). The ECL circuit further includes an output driver circuit for coupling to an input of a CMOS circuit or to another ECL circuit. The output driver circuit has an input node coupled to an output of the ECL core circuitry and includes emitter followers ($EF_1$, $EF_2$) for generating, in response to the intermediate electrical signal swinging between $V_2$ and $V_3$, a first output signal tha swings between the $V_0$ and $V_1$.

20 Claims, 2 Drawing Sheets

CMOS AND ECL LOGIC CIRCUIT REQUIRING NO INTERFACE CIRCUITRY

FIELD OF THE INVENTION

This invention relates generally to electronic circuitry and, in particular, to circuitry for achieving a direct electrical coupling between a complementary metal oxide semiconductor (CMOS) circuit and an emitter-coupled logic (ECL) circuit.

BACKGROUND OF THE INVENTION

CMOS circuitry and ECL circuitry are typically considered to be incompatible due to the significantly different voltage swings and levels employed by each. While it is possible to overcome such differences by providing attenuators or amplifiers, the use of such additional components results in undesirable signal delays, increased power consumption, and a requirement for additional circuit area.

A desirable goal is to provide an arrangement by which CMOS and ECL circuits may communicate directly with one another without requiring special interfaces. However, conventional practice has not achieved this goal.

The following chronologically ordered U.S. Patents are illustrative of various conventional CMOS/ECL interfacing techniques and related technology.

In U.S. Pat. No. 4,656,375, issued Apr. 7, 1987, entitled "Temperature Compensated CMOS to ECL Translator", Lauffer et al. disclose circuitry that provides a complimentary switching circuit for switching an output terminal between two voltage levels corresponding to the logic levels of an ECL logic circuit. A normally unused ECL logic circuit provides the two voltage levels to a complimentary switch for achieving a temperature compensation function.

In U.S. Pat. No. 4,782,251, issued Nov. 1, 1988, entitled "Level Conversion Circuit", Tsugaru et al. describe a level conversion circuit for converting CMOS level signals to ECL level signals. A differential amplifier circuit is inserted between a high potential voltage source and a low potential voltage source and selects a current path flowing therebetween. A bipolar transistor is coupled to a collector potentials of one of the bipolar transistors and outputs ECL logic levels from its emitter terminal.

In U.S. Pat. No. 4,794,317, issued Dec. 27, 1988, entitled "ECL-To-CMOS Level Conversion For Use in ECL-BICMOS Circuit", van Tran discloses an ECL-to-CMOS level shifter. The level shifter uses a CMOS convertor that is coupled directly to an ECL buffer. A voltage drop across a resistor shifts the ECL logic levels down to a trip point of the CMOS convertor. The voltage drop across this resistor is set such that the trip point of the CMOS convertor is at half the output voltage of the ECL buffer.

U.S. Pat. No. 4,806,799, issued Feb. 21, 1989, entitled "ECL to CMOS Translator", to Pelley, III et al., discloses an ECL-to-CMOS translator. The translator includes an NPN transistor having a base that receives an ECL output signal. A control circuit couples the emitter of the NPN transistor to an intermediate node in response to the ECL output signal switching.

U.S. Pat. No. 4,864,159, issued Sep. 5, 1989, entitled "ECL to CMOS Transition Amplifier", to Cornellissen, discloses an amplifier for adjusting logic levels used in ECL logic to logic levels used in CMOS logic. The approach of Cornellissen is to employ first and second parallel arranged branches coupled between first and second supply voltage lines.

In U.S. Pat. No. 4,890,019, issued Dec. 26, 1989, entitled "Bilingual CMOS to ECL Output Buffer", Hoyte et al. describe an output buffer that converts a standard CMOS signal from a (0, +5) volt domain into a standard ECL signal in a (−0.8, −1.6) volt domain. A pair of "grounded-well" CMOS transistors are employed by the output buffer.

In commonly assigned U.S. Pat. No. 4,897,564, issued Jan. 30, 1990, entitled "BICMOS Driver Circuit for High Density CMOS Logic Circuits" Chen discloses a BICMOS driver circuit with voltage swing levels shifted with respect to a following CMOS logic circuit voltage level. This permits the BICMOS driver circuit to generate a low logic level that is substantially below the threshold voltage of the CMOS logic, and a high logic level that overdrives the CMOS logic.

U.S. Pat. No. 4,906,871, issued Mar. 6, 1990, entitled "Level Shift Circuit for Converting a Signal in an ECL Level into a Signal in a CMOS Logic Level", to Iida, discloses an AC coupled level shift circuit that includes a capacitor that is coupled at a first electrode to an output stage of an ECL circuit, a MOS inverter that is connected to a second electrode of the capacitor, and an output node of the MOS inverter is coupled to an input stage of a CMOS circuit. A bias circuit is provided for applying a bias voltage to the input node of the MOS inverter.

In U.S. Pat. No. 4,912,347, issued Mar. 27, 1990, entitled "CMOS to ECL Output Buffer" Morris discloses a CMOS to ECL output buffer that includes a current source that provides a current for establishing an ECL logic "zero" output voltage. The current from the current source also tracks variations in the resistance of a resistor to maintain essentially constant a voltage difference between an ECL logic "one" and the ECL logic "zero" output voltage.

Finally, in U.S. Pat. No. 4,914,321, issued Apr. 3, 1990, entitled "BIMOS Level Convertor", by D. E. Davis, there is described a BIMOS level convertor that includes a differential circuit having a common biasing network. A MOS transistor in one portion of the differential circuit receives a MOS level input signal and provides an ECL level output signal. The differential circuit also includes a bipolar transistor that is biased by the MOS transistor to generate a complimentary ECL level output signal. This combination is said to provide a single ended MOS to differential ECL interface.

What is not taught by these U.S. Patents, and what is thus one object of the invention to provide, is an arrangement whereby CMOS and ECL circuits may directly drive one another.

It is a further object of the invention to provide an ECL circuit that may be directly coupled to a CMOS circuit without requiring intermediate interface circuitry.

SUMMARY OF THE INVENTION

The foregoing and other problems are overcome and the objects of the invention are realized by an ECL circuit for directly coupling to a CMOS circuit, the ECL circuit including an input node for receiving an input signal generated by a CMOS circuit. The input signal swings, or transitions, between a first potential ($V_0$) and a second potential ($V_1$) The ECL circuit further includes ECL core circuitry, coupled to the input node and responsive to the received signal, for generating an intermediate electrical signal that swings between a third potential $V_2$ and a fourth potential $V_3$. $V_3$ is equal to approximately $V_2+(V_1-V_0)$. The ECL circuit further includes an output node for coupling to an input of a CMOS circuit or to another ECL circuit. The output node of the ECL core circuitry has an input coupled to an ECL output driver for generating, in response to the intermediate electrical signal swinging between $V_2$ and $V_3$, a first output signal that swings between $V_0$ and $V_1$.

The ECL core circuitry includes a first bipolar transistor having a base terminal for coupling to the input signal and a collector terminal coupled to a power bus through a first load. The ECL core circuitry further includes a second bipolar transistor having a base terminal coupled to a reference potential of $(V_1-V_0)/2$, a collector terminal coupled to the power bus through a second load, and an emitter terminal coupled, in common with an emitter terminal of the first bipolar transistor, to a current source.

The output driver circuitry includes a first emitter follower having an input terminal coupled to the collector of the first bipolar transistor and an output terminal for providing the first output signal. The output driver circuitry further includes a second emitter follower having an input terminal coupled to the collector of the second bipolar transistor and an output terminal for providing a second output signal therefrom, the second output signal being complementary to the first output signal. A collector terminal of each of the emitter followers is coupled to a potential that is sufficiently high to keep the emitter follower out of saturation during operation. Each emitter follower has an active emitter load comprised of an N-channel FET. The N-channel FETs are cross-coupled into a half-latch configuration. The emitter followers provide a shift of the ECL core signals ($V_2$ to $V_3$) to external output signals ($V_0$ to $V_1$).

In an exemplary embodiment of the invention $V_0$ is approximately zero volts (ground potential), $V_1$ is approximately 1.4 volts, $V_2$ is also approximately 1.4 Volts, $V_3$ is approximately 2.8 volts, and the reference potential is approximately 0.7 volts.

BRIEF DESCRIPTION OF THE DRAWING

The above set forth and other features of the invention are made more apparent in the ensuing Detailed Description of the Invention when read in conjunction with the attached Drawings, wherein.

DETAILED DESCRIPTION OF THE INVENTION

Figure 1:
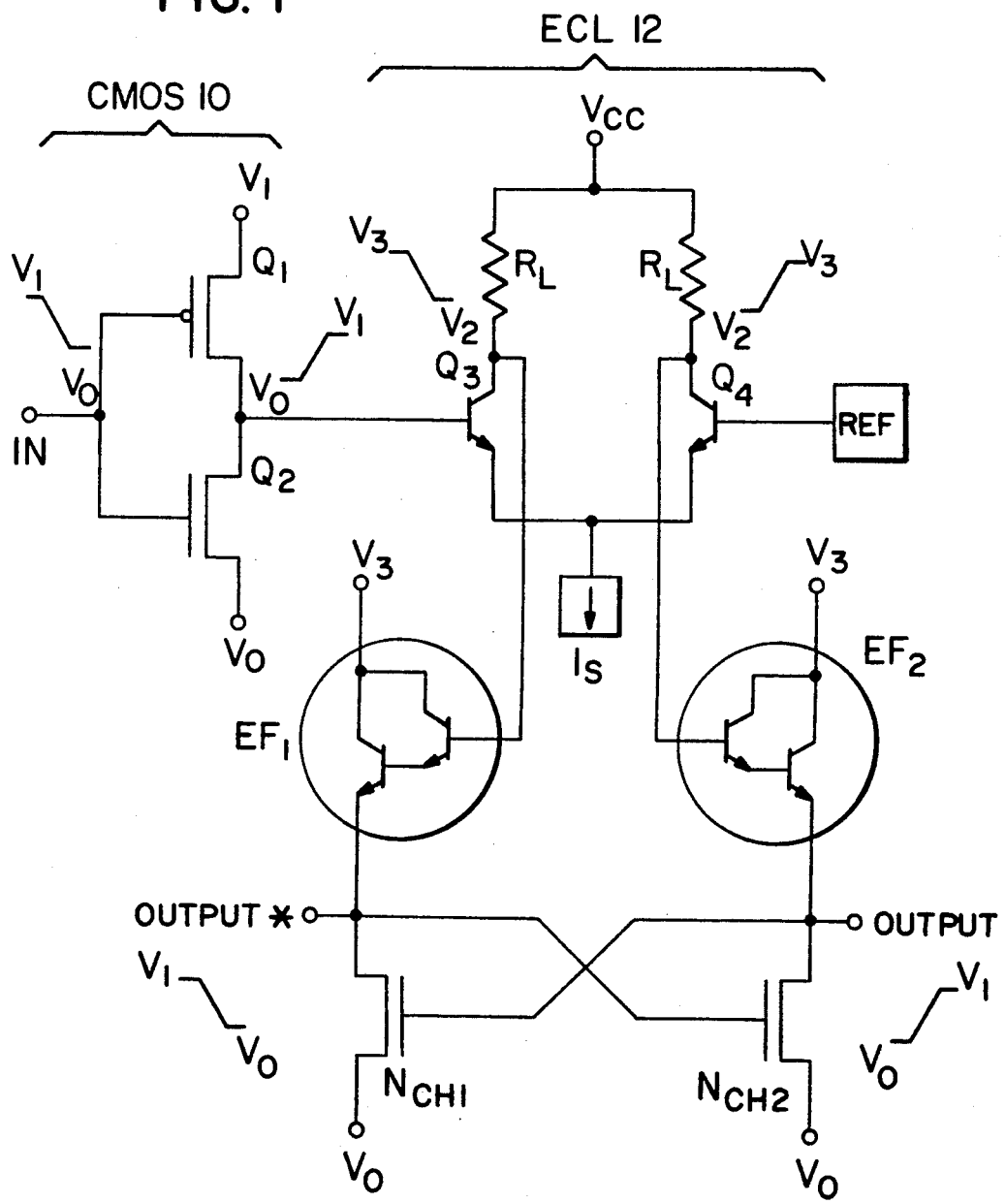
FIG. 1 is a schematic diagram illustrating the circuitry of the invention.

FIG. 1 illustrates an embodiment of the invention wherein a CMOS circuit 10*, by example an inverter but typically a more complex logic function, has an output coupled to an input of an ECL circuit 12*, also by example shown as an inverter but typically a more complex logic function. ECL circuit 12* has a first output (OUTPUT) and a second, complementary output (OUTPUT*). The asterisk (*) is employed herein to designate a complementary output. As such, when OUTPUT is high OUTPUT* is low and vice versa.

CMOS circuit 10 has an input coupled to the gates of a pair of serially connected transistors $Q_1$ and $Q_2$. $Q_1$ and $Q_2$ are connected between, for this embodiment, a power bus having a potential of $V_0$. The output of the CMOS circuit 10 is taken at the junction of $Q_1$ and $Q_2$ and thus swings between $V_0$ and a higher potential $V_1$. As can be realized, the construction of CMOS circuit 10 is conventional in nature. An important consideration are the values of $V_0$ and $V_1$, as will be described in detail below.

ECL circuit 12 includes a pair of "core" bipolar transistors $Q_3$ and $Q_4$. The collectors of $Q_3$ and $Q_4$ are each coupled to a power rail ($V_{cc}$) through an associated load resistor $R_L$. The emitters of $Q_3$ and $Q_4$ are tied in common to a current source $I_S$. The base of $Q_4$ is coupled to a voltage reference (REF).

In accordance with the invention the base of $Q_3$, that is the input node of the ECL circuit 12, is directly coupled to the output of the CMOS circuit 10*.

To maintain high speed operation of the ECL circuit 12* it is important to avoid saturation of $Q_3$ and $Q_4$. This is accomplished by biasing the ECL circuit 12* so as to swing from a voltage potential of $V_2$ to $V_3$, while the CMOS circuit 10 output swings from $V_0$ to $V_1$. $V_3$ is approximately $V_2+(V_1-V_0)$. Under this condition, which is achieved by a proper selection of the values of $V_{cc}$, $R_L$ and $I_s$, saturation is prevented. However, inasmuch as the output level of CMOS circuit 10 is centered at $(V_1-V_0)/2$, while the output at the collectors of $Q_3$ and $Q_4$ is centered at $(V_3-V_2)/2$, the output of the ECL circuit 12* is at a potential that is greater than that required for interfacing to the input of other CMOS circuitry.

In order to overcome this condition the ECL circuit 12* includes output driver circuitry for dropping a potential equal to or greater than $V_{be}$ of $Q_3$ and $Q_4$. Specifically, this output driver circuitry includes transistors configured in an emitter follower configuration. A single emitter follower may be employed to insert one diode drop in the output signal. For the illustrated embodiment each output driver circuit includes two emitter followers, coupled together in a Darlington emitter follower configuration, to insert two diode drops between the output of each of the ECL core transistors $Q_3$ and $Q_4$ and the output nodes. For other embodiments, additional emitter followers may be employed to insert additional diode drops as required. In FIG. 1 it can be seen that a first Darlington emitter follower ($EF_1$) and a second Darlington emitter follower ($EF_2$) are coupled to the collector of $Q_3$ and the collector of $Q_4$, respectively. $EF_1$ and $EF_2$ each add two diode drops, or approximately 1.4 volts, to the base-emitter path of $Q_3$ and $Q_4$, respectively. Further in accordance with the invention the output of the ECL circuit 12* is taken from the output emitters of $EF_1$ and $EF_2$ and swings between $V_0$ and $V_1$, which is the desired result for directly interfacing to the input of other CMOS logic or to the input of other ECL logic constructed in accordance with the ECL circuit 12*. As a result, mixed CMOS-ECL integrated circuit implementations are made possible without a requirement for specialized amplifiers and level convertors to be included on the integrated circuit.

In order to overcome the typically high power requirement associated with a Darlington emitter follower configuration the circuit of the invention further provides an active emitter load device, specifically an n-channel FET, as a load for the Darlington emitter follower circuits $EF_1$ and $EF_2$. A first N-channel FET ($N_{CH1}$) is coupled between $V_0$ and the emitter of $EF_1$. The gate of $N_{CH1}$ is coupled to a node comprised of the emitter of $EF_2$ and the drain of a second N-channel FET ($N_{CH2}$). The gate of $N_{CH2}$ is coupled to a node comprised of the emitter of $EF_1$ and the drain of $N_{CH1}$. As such, the gate of each N-channel FET emitter load is driven by the opposite emitter follower output. It is noted that there is a half-latch implicit in this circuit arrangement. However, the drive of each of the emitter followers is sufficient to readily pull up the output node (OUTPUT or OUTPUT*) against the conducting N-channel FET. Furthermore, once a threshold of the conducting N-channel device is reached, positive feedback accelerates the rise of the output node that is turning off.

More specifically, the operation of this positive feedback is illustrated by considering an initial condition in which the collector of $Q_3$ is high at $V_3$ and the collector of $Q_4$ is low at $V_2$. Consequently, the node OUTPUT* is high at $V_1$, pulled up by $EF_1$, and node OUTPUT is low, pulled down by $N_{CH2}$. When the input at the base of $Q_3$ rises from $V_0$ to $V_1$, $Q_3$ turns on and $Q_4$ turns off. Thus, the voltage at the collector of $Q_3$ drops from high ($V_3$) to low ($V_2$) while the voltage at the collector of $Q_4$ rises from low ($V_2$) to high ($V_3$). The rising collector voltage at $Q_4$ turns on $EF_2$, pulling node OUTPUT up from the $V_0$ level. Initially, some of the current supplied by $EF_2$ to node OUTPUT is shunted to ground through $N_{CH2}$. However, once node OUTPUT rises to the threshold voltage of $N_{CH1}$, $N_{CH1}$ turns on, pulling down node OUTPUT* (since $EF_1$ has been turned off by the fall of the voltage at the collector of $Q_3$) and turning off $N_{CH2}$, eliminating the shunting of current from node OUTPUT to $V_0$, thus accelerating the rise of node OUTPUT and eliminating DC power in the emitter follower.

Figure 2:
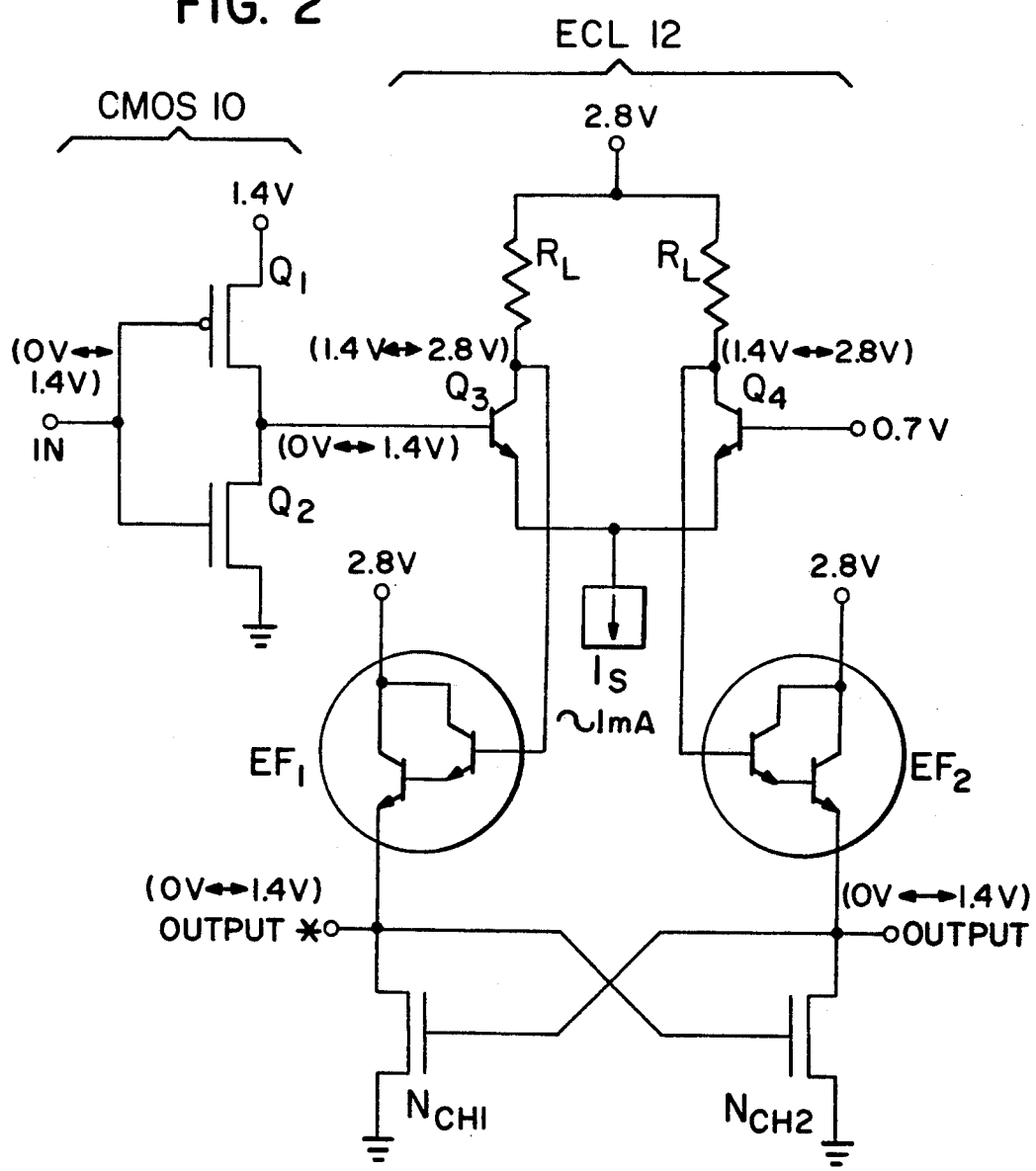
FIG. 2 is a schematic diagram showing one embodiment of the circuitry of FIG. 1 and specific voltage levels for use therewith.

Referring to FIG. 2 there is shown a specific embodiment of the circuit of FIG. 1. For the circuit of FIG. 2 the base-to-emitter drop of $Q_3$ and $Q_4$ is considered to be 0.7 volts when the devices are turned on. The value of both $V_1$ and $V_2$ is considered to be $2V_{be}$, or 1.4 volts. The potential $V_3$ is 2.8 volts as is $V_{cc}$. The value of REF is $(V_1-V_0)/2$, or 0.7 volts. The Darlington emitter follower output drivers $EF_1$ and $EF_2$ each drop a potential equal to $2V_{be}$ resulting in their respective emitter output nodes swinging between ground potential and $V_1$, or zero volts to 4 volts. The output stage of the CMOS circuit 10* is coupled between ground potential and 1.4 volts for providing the swing between $V_0$ and $V_1$ that is input to the ECL circuit 12*. Is chosen to provide appropriate power and/or performance in the ECL circuit 10, with a typical value being one milliamp. The value of RL is selected such that $(R_L \times I_S = (V_0 - V_1) = 1.4$ volts).

Furthermore, in the description of the preferred embodiments of the invention it has been assumed that during operation the minimum collector-to-emitter voltage (min$V_{ce}$) is equal to the maximum base-to-emitter voltage (max$V_{be}$) of $Q_3$ and $Q_4$ in order to prevent saturation. However, this is an approximate and conservative constraint. That is, the circuit may be operated with $V_{ce}$ below $V_{be}$ in order to further reduce the ECL circuit 12* power supply level and power consumption, provided $Q_3$ and $Q_4$ remain out of saturation.

Although described in the context of a presently preferred embodiment it should be appreciated that a number of modifications may be made to the circuit depicted in FIGS. 1 and 2 while not departing from the teaching of the invention. For example, in FIG. 2 the circuitry may be operated at some potential other than between ground potential and a higher potential, that is, the ground potential bus may instead be a voltage potential bus. Also, the number of emitter followers that comprise $EF_1$ and $EF_2$ may be any number from one to a number required to achieve the desired potential at the output nodes of the ECL circuit 12*. Also, $N_{CH1}$ and $N_{CH2}$ could each be replaced with a resistance at the expense of increased power consumption.

Thus, while the invention has been particularly shown and described with respect to a preferred embodiment thereof, it will be understood by those skilled in the art that changes in form and details may be made therein without departing from the scope and spirit of the invention.

Having thus described our invention, what we claim as new, and desire to secure by Letters Patent is:

1. An emitter-coupled logic circuit for directly coupling to a CMOS circuit, comprising:
input node means for receiving an input signal from a CMOS circuit operating between a first potential $V_0$ and a second potential $V_1$;
means, coupled to the input node means and responsive to the received signal, for generating an intermediate electrical signal that swings between a third potential $V_2$ and a fourth potential $V_3$, wherein $V_3$ is equal to approximately $V_2 + (V_1 - V_0)$; and
output node means, having an input coupled to an output of the generating means, for outputting, in response to the intermediate electrical signal swinging between $V_2$ and $V_3$, a first output signal that swings between $V_0$ and $V_1$.

2. An emitter-coupled logic circuit as set forth in claim 1 wherein the generating means includes a first bipolar transistor having a base terminal coupled to the input node means and a collector terminal coupled to a power bus through a load means, and wherein the output node means includes a first emitter follower means having an input terminal coupled to the collector of the first bipolar transistor and an output terminal for providing the first output signal therefrom.

3. An emitter-coupled logic circuit as set forth in claim 2 and further comprising first active load means coupled between the output terminal of the first emitter follower means and the first potential $V_0$.

4. An emitter-coupled logic circuit as set forth in claim 3 wherein the first active load means includes an N-channel FET.

5. An emitter coupled logic circuit as set forth in claim 1 wherein the generating means includes a bipolar transistor having a base terminal coupled to the input node means and a collector terminal coupled to a power bus through a load means, and wherein the output node means includes means for dropping a potential equal to or greater than $V_{be}$ of the bipolar transistor, the dropping means having an output terminal coupled to the output node means for providing the first output signal thereto.

6. An emitter-coupled logic circuit as set forth in claim 1 wherein $V_0$ is approximately zero volts, wherein $V_1$ and $V_2$ are each approximately 1.4 volts, and wherein $V_3$ is approximately 2.8 volts.

7. An emitter-coupled logic circuit as set forth in claim 2 wherein the generating means further includes a second bipolar transistor having a base terminal coupled to a reference potential, a collector terminal coupled to the power bus through a second load means, and an emitter terminal coupled, in common with an emitter terminal of the first bipolar transistor, to a current source means, and wherein the output node means includes a second emitter follower means having an input terminal coupled to the collector of the second bipolar transistor and an output terminal for providing a second output signal therefrom, the second output signal being complementary to the first output signal.

8. An emitter-coupled logic circuit as set forth in claim 7 and further comprising first active load means coupled between the output terminal of the first emitter follower means and $V_0$, wherein the first active load means includes an N-channel FET, and further comprising second active load means coupled between the output terminal of the second emitter follower means and the first potential, wherein the second active load means includes a second N-channel FET, wherein a gate terminal of the first N-channel FET is coupled to the output terminal of the second emitter follower means, and wherein a gate terminal of the second N-channel FET is coupled to the output terminal of the first emitter follower means.

9. An emitter-coupled logic circuit as set forth in claim 7 wherein the reference potential is equal to approximately $(V_1-V_0)/2$.

10. An emitter-coupled logic circuit as set forth in claim 7 wherein $V_0$ is approximately zero volts, wherein $V_1$ and $V_2$ are each approximately 1.4 volts, wherein $V_3$ is approximately 2.8 volts, and wherein the reference potential is approximately 0.7 volts.

11. An emitter-coupled logic circuit as set forth in claim 2 wherein the first emitter follower means is comprised of a pair of bipolar transistors coupled together in a Darlington configuration, wherein a collector of each of the pair of bipolar transistors is coupled to a voltage potential equal to approximately $V_3$, and wherein an output emitter terminal of the Darlington configuration is coupled through an emitter load means to $V_0$.

12. An ECL circuit for directly coupling to a CMOS circuit, the ECL circuit comprising:
input node means for receiving an input signal generated by a CMOS circuit operating between a first potential $V_0$ and a second potential $V_1$, the input signal swinging between the first potential $V_0$ and the second potential $V_1$;
means, coupled to the input node means and responsive to the received signal, for generating an intermediate electrical signal that swings between a third potential $V_2$ and a fourth potential $V_3$, wherein $V_3$ is equal to approximately $V_2+(V_1-V_0)$; and
output node means for coupling to an input of a CMOS circuit or an input of another ECL circuit, the output node means having an input coupled to an output of the generating means for outputting, in response to the intermediate electrical signal swinging between $V_2$ and $V_3$, a first output signal that swings between $V_0$ and $V_1$;
wherein the generating means includes:
a first bipolar transistor having a base terminal coupled to the input node means and a collector terminal coupled to a power bus through a load means; and
a second bipolar transistor having a base terminal coupled to a reference potential, a collector terminal coupled to the power bus through a second load means, and an emitter terminal coupled, in common with an emitter terminal of the first bipolar transistor, to a current source means;
and wherein the output node means includes:
first emitter follower means having an input terminal coupled to the collector of the first bipolar transistor and an output terminal for providing the first output signal therefrom; and
second emitter follower means having an input terminal coupled to the collector of the second bipolar transistor and an output terminal for providing a second output signal therefrom, the second output signal being complementary to the first output signal.

13. An ECL circuit as set forth in claim 12 and further comprising:
first active load means coupled between the output terminal of the first emitter follower means and $V_0$; and
second active load means coupled between the output terminal of the second emitter follower means and $V_0$.

14. An ECL circuit as set forth in claim 13 wherein the first and the second active load means each includes an N-channel FET.

15. An ECL circuit as set forth in claim 13 wherein the first emitter follower means and the second emitter follower means are each comprised of a pair of bipolar transistors coupled together in a Darlington configuration, wherein a collector terminal of each of the pair of transistors is coupled to a voltage potential equal to approximately $2(V_1-V_0)$, and wherein an output emitter terminal of each of the Darlington configuration is coupled to an associated one of the active load means.

16. An ECL circuit as set forth in claim 14 wherein a gate terminal of the first N-channel FET is coupled to the output terminal of the second emitter follower means, and wherein a gate terminal of the second N-channel FET is coupled to the output terminal of the first emitter follower means.

17. An ECL circuit as set forth in claim 12 wherein $V_0$ is approximately zero volts, wherein $V_1$ and $V_2$ are each approximately 1.4 volts, wherein $V_3$ is approximately 2.8 volts, and wherein the reference potential is approximately 0.7 volts.

18. An emitter-coupled logic circuit, comprising:
input node means for receiving an input signal that swings between a first potential $V_0$ and a second potential $V_1$;
means, coupled to the input node means and responsive to the received signal, for generating an intermediate electrical signal that swings between a third potential $V_2$ and a fourth potential $V_3$, wherein $V_3$ is equal to approximately $V_2+(V_1-V_0)$; and
output node means, having an input coupled to an output of the generating means, for outputting, in response to the intermediate electrical signal swinging between $V_2$ and $V_3$, a first output signal that swings between $V_0$ and $V_1$.

19. An emitter-coupled logic circuit as set forth in claim 18 wherein $V_0$ is approximately zero volts, wherein $V_1$ and $V_2$ are each approximately 1.4 volts, and wherein $V_3$ is approximately 2.8 volts.

20. An emitter-coupled logic circuit as set forth in claim 18 wherein the generating means includes:
a first bipolar transistor having a base terminal coupled to the input node means and a collector terminal coupled to a power bus through a load means; and a second bipolar transistor having a base terminal coupled to a reference potential, a collector terminal coupled to the power bus through a second load means, and an emitter terminal coupled, in common with an emitter terminal of the first bipolar transistor, to a current source means;

wherein the output node means includes:

first emitter follower means having an input terminal coupled to the collector of the first bipolar transistor and an output terminal for providing the first output signal therefrom; and second emitter follower means having an input terminal coupled to the collector of the second bipolar transistor and an output terminal for providing a second output signal therefrom, the second output signal being complementary to the first output signal;

the emitter-coupled logic circuit further comprising, first active load means coupled between the output terminal of the first emitter follower means and $V_0$ and second active load means coupled between the output terminal of the second emitter follower means and $V_0$.

* * * * *